(12) United States Patent
Chittipeddi

(10) Patent No.: US 6,762,087 B1
(45) Date of Patent: Jul. 13, 2004

(54) PROCESS FOR MANUFACTURING AN INTEGRATED CIRCUIT INCLUDING A DUAL-DAMASCENE STRUCTURE AND A CAPACITOR

(75) Inventor: Sailesh Chittipeddi, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 148 days.

(21) Appl. No.: 09/596,382

(22) Filed: Jun. 16, 2000

(51) Int. Cl.$^7$ .......................................... H01L 21/8242
(52) U.S. Cl. .................... 438/238; 438/250; 438/381
(58) Field of Search ................ 438/3, 238–241, 438/250–256, 381, 393–399

(56) References Cited

U.S. PATENT DOCUMENTS

| | | | | |
|---|---|---|---|---|
| 5,633,781 | A | 5/1997 | Saenger et al. | 361/321.4 |
| 6,037,216 | A | 3/2000 | Liu et al. | 438/255 |
| 6,071,806 | A | 6/2000 | Wu et al. | |
| 6,156,640 | A | 12/2000 | Tsai et al. | |
| 6,174,803 | B1 | 1/2001 | Harvey | |
| 6,207,560 | B1 | 3/2001 | Lee | |
| 6,228,711 | B1 * | 5/2001 | Hsieh | 438/255 |
| 6,251,740 | B1 * | 6/2001 | Johnson et al. | 438/244 |
| 6,281,134 | B1 | 8/2001 | Yeh et al. | |
| 6,303,423 | B1 * | 10/2001 | Lin | 438/238 |
| 6,346,454 | B1 * | 2/2002 | Sung et al. | 438/396 |

FOREIGN PATENT DOCUMENTS

| | | |
|---|---|---|
| EP | 1 022 783 A2 | 7/2000 |
| EP | 1 022 783 A3 | 6/2001 |
| GB | 2 356 973 A | 8/1999 |
| GB | 2 356 974 A | 6/2001 |

OTHER PUBLICATIONS

Patent No. 6,025,226, Filed on Jan. 15, 1998 and issued on Feb. 15, 2002 to Jeffrey P. Gambino Class: 438/244.
Patent No. GB 2 356 974 A issued in Great Britain on Jun. 6, 2001 to Sailesh Chittipeddi et al. Class: H01L 21/768; Translation: Yes.
Patent No. GB 2 356 973 A issued in Great Britain on Jun. 6, 2001 to Sailesh Chittipeddi et al. Class: H01L 21/768; Translation: Yes.
Patent No. EP 1 022 783 A2 issued in Europe on Jul. 26, 2000 to Glenn Alers et al. Class: H01L 27/108; Translation: Yes.
Patent No. EP 1 020 905 A1 issued in Europe on Jul. 19, 2000 to Chun–yung Sung et al. Class: H01L 21/768; Translation: Yes.
European Standard Search Report—Dated: Feb. 26, 2002.

* cited by examiner

Primary Examiner—H. Jey Tsai

(57) ABSTRACT

The present invention is directed to a process for forming a dual damascene structure and a capacitor. The process includes forming a stack including insulating layers and a stop layer. The stack is patterned so that the openings used to form the sidewall capacitors may be formed when the vias or grooves of the dual damascene structure is formed. In this way, the process for manufacturing the sidewall capacitors may be integrated with the dual damascene process without adding additional mask or etching steps.

8 Claims, 6 Drawing Sheets

PROCESS FOR MANUFACTURING AN INTEGRATED CIRCUIT INCLUDING A DUAL-DAMASCENE STRUCTURE AND A CAPACITOR

FIELD OF THE INVENTION

The present invention relates generally to integrated circuits and, more particularly, to a process for forming dual damascene structures and capacitors in an integrated circuit.

BACKGROUND OF THE INVENTION

Interdigitized or finger capacitors are being used more in integrated circuits as the height of metal lines in the integrated circuits become greater than the space between the metal lines. This occurs because device dimensions are decreasing which results in a corresponding decrease in distance between metal lines. Interdigitized or finger capacitors employ sidewall capacitance, the capacitance produced between adjacent metal lines to form a capacitor.

One example of a finger capacitor is shown in U.S. Pat. No. 6,037,621 entitled ON CHIP CAPACITOR STRUCTURE and issued to Wilson. This patent is incorporated herein by reference. The concept of using sidewall capacitance to form capacitors is also discussed in a recent paper entitled Fractal Capacitors, H. Samavati, et al., 1998 ISSCC, Session 16, TD: Advanced Radio-Frequency Circuits, Paper FP 16.6, 256–57, which is incorporated herein by reference. The paper points out that sidewall or fringing capacitance yields a higher capacitance per unit area than conventional parallel plate capacitors as the distance between the plates decreases.

In addition to device dimension decreases, there has been trend to use dual damascene structures instead of single damascene structures. Single damascene is an interconnection fabrication process for integrated circuits in which grooves are formed in an insulating layer and filled with a conductive material to form interconnects. Dual damascene is a multi-level interconnection process in which, in addition to forming the grooves of single damascene, conductive contact (or via) openings are also formed in the insulating layer. A conductive material is formed in the grooves and conductive contact (or via) openings. The inventor has recognized the need to combine these trends to provide a sidewall capacitor in an integrated circuit also including a dual damascene structure.

SUMMARY OF THE INVENTION

The present invention is directed to a process for forming a dual damascene structure and a capacitor. The process includes forming a stack including insulating layers and a stop layer. The stack is patterned so that the openings used to form the sidewall capacitors may be formed when the vias or grooves of the dual damascene structure are formed. In this way, the process for manufacturing the sidewall capacitors may be integrated with the dual damascene process without adding additional mask or etching steps.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

The illustrative embodiment of the present invention is directed to a process for forming a dual damascene structure. The process includes forming a stack including insulating layers and a stop layer where two masks are formed above the stack. One of the masks is used to form via or contact openings in the insulating layers and to form openings for a capacitor. The second mask is used to form grooves for interconnections in the insulating layers. By forming the openings for the capacitors when the grooves and vias for the dual damascene structure are formed, the number of processing steps and movement of the partially fabricated integrated circuit between systems may be reduced.

Figure 1:
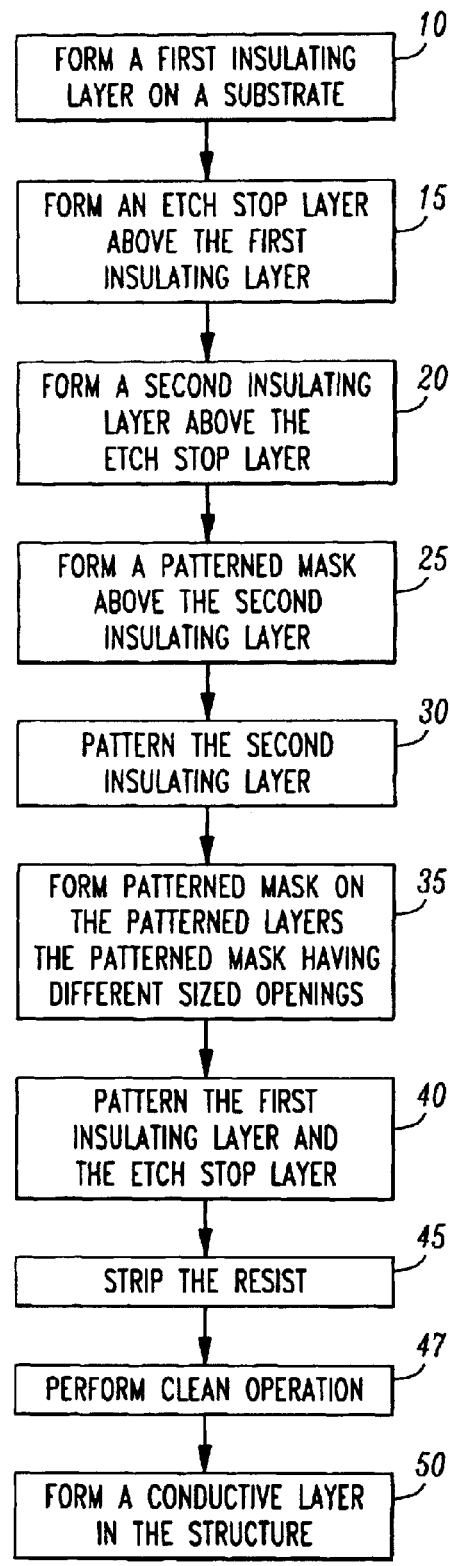
FIG. 1 is a flowchart diagram illustrating the process for manufacturing an integrated circuit according to an illustrative embodiment of the present invention.
Figure 2:
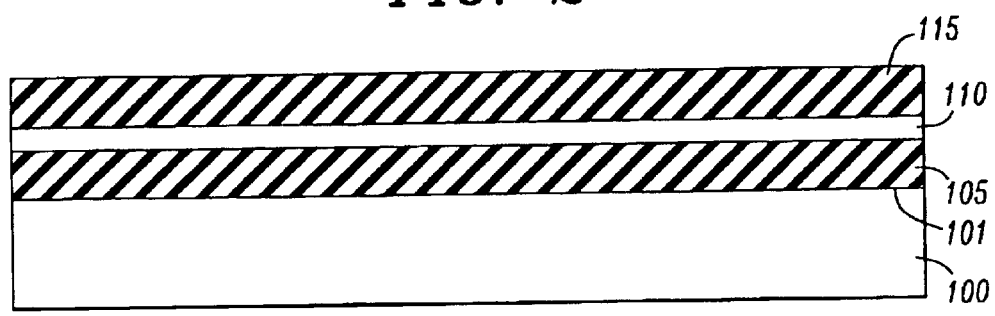
FIGS. 2–7 are schematic diagrams of an integrated circuit during successive stages of manufacture using the process of FIG. 1.
Figure 3:
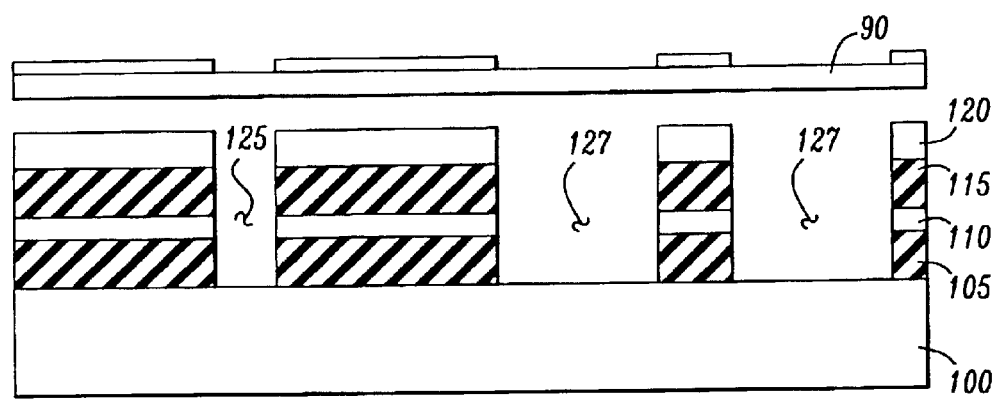
Figure 4:
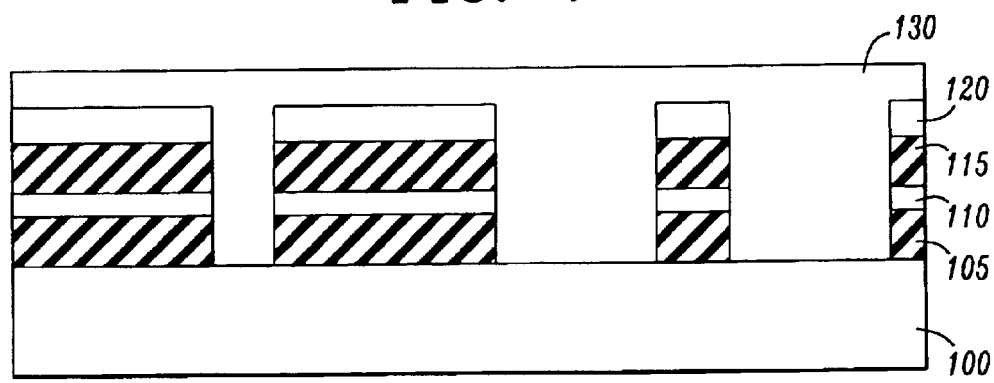
Figure 5:
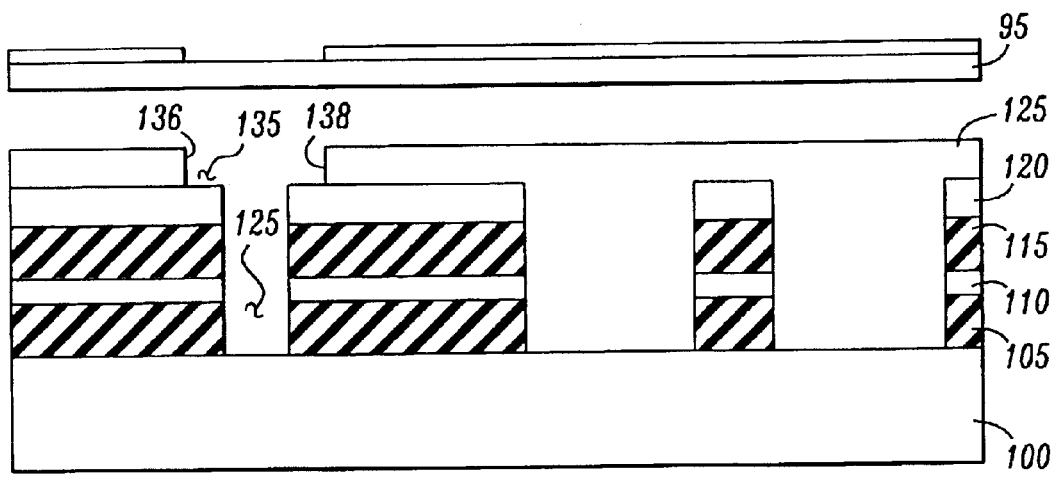
Figure 6:
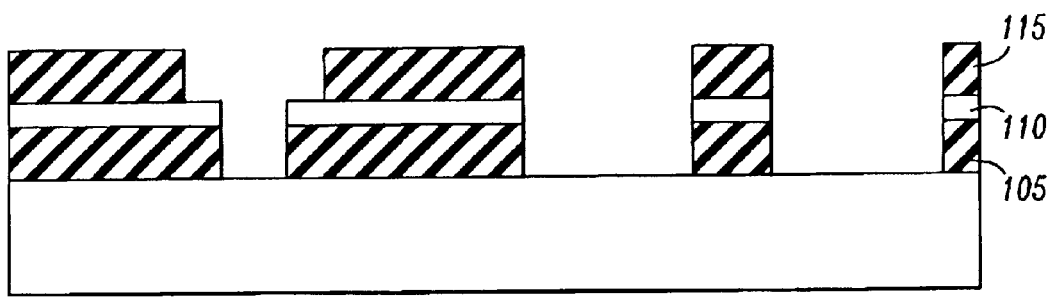

Referring now to the drawing, wherein like reference numerals refer to like elements throughout, FIG. 1 is a flow chart diagram illustrating an exemplary embodiment of the present invention. FIGS. 2–7 are schematic diagrams illustrating the successive stages of manufacture of an integrated circuit according to the flow chart shown in FIG. 1.

At step 10, a first insulating layer 105 is formed on a substrate 100. The first insulating layer 105 is, for example, a dielectric such as a high-density deposited silicon oxide (e.g., $SiO_2$). Alternatively, the first insulating layer may be a borophosphosilicate glass, a phosphosilicate glass, a glass formed from phosphorous and/or boron-doped tetraethyl orthosilicate, spin-on glass, xerogels, aerogels, or other low dielectric constant films such as a polymer, fluorinated oxide and hydrogen silsesquioxane. Further, the insulating layer may include multiple layers where at least one layer is a low dielectric constant material formed between other layers that may have a higher dielectric constant.

The substrate 100 is, for example, a semiconductor such as silicon or compound semiconductor such as GaAs or SiGe. Alternatively, the substrate 100 may be an intermediate layer in an integrated circuit such as a dielectric, conductor, or other material. In addition, the upper surface 101 of the substrate 100 may not be planar. In this case, the first insulating layer 105 may be planarized using, for example, chemical mechanical polishing (CMP) as is well known.

At step 15, an etch stop layer 110 is formed above or in direct contact with the first insulating layer 105. In an alternative embodiment, one or more layers may be formed between the etch stop layer 110 and the first insulating layer 105. The material for the etch stop layer may be selected to be more etch resistant than the second insulating layer 115 for a selected etchant. In other words, the etch stop layer 110 etches at a slower rate than the second insulating layer 105 when exposed to a selected etchant. For example, the etch stop layer may be TiN where the second insulating is $SiO_2$. Further, the etch stop layer may be Ta/TaN, $Si_3N_4$, a silicon-rich oxide, or a multi-layered $SiO_2$ dielectric.

At step 20, a second insulating layer 115 is formed above or in direct contact with the etch stop layer 115. The second layer 115 may be formed using the same materials and processes used to form the first insulating layer 105. At step 25, a first patterned mask 120 is formed above or on the insulating layer 115. The first patterned mask 120 includes openings that correspond to the via or contact openings 125 (hereinafter referred to as "openings") to provide interconnections between different levels in the integrated circuit. In addition, the first patterned mask 120 includes openings that correspond to the openings 127 for a capacitor (hereinafter referred to as the "capacitor openings"). The reticle 90 has a pattern so that capacitor openings 127 may be formed when openings 125 are formed.

At step 30, openings 125 and the capacitor openings 127 are opened in the first insulating layer 105, the etch stop layer 110, and the second insulating layer 115. The openings and the capacitor openings may be opened using conventional etching techniques or a combination of techniques to etch through at least the three different layers. Alternatively, step 30 may etch only the second insulating 115. In this case, at step 40, the exposed portion of the etch stop layer 110 and the corresponding portion of the first insulating 105 below the exposed portion would be etched to complete the capacitor openings 127 and the openings 125 when the groove is etched. The capacitor openings 127 may be formed in the same metallization level and not above or below each other Illustratively, the openings are formed by: 1) applying a layer of resist material (the first patterned mask) on the second insulating layer 115; 2) exposing the resist material to an energy source which passes through a reticle; 3) removing areas of resist to form the pattern in the resist; and 4) etching the openings 125 and capacitor openings 127. The energy source may be an e-beam, light source, or other suitable energy source.

Subsequently, at step 35, a second patterned mask 130 is formed above or on the first patterned mask 120. Illustratively, the second patterned mask 130 is formed by: 1) applying a layer of resist material in the openings 125 and 127 on the first patterned mask 120; 2) exposing the resist material to an energy source which passes through a reticle 95; and 3) removing areas of resist to form the pattern in the resist. The energy source may be an e-beam, light source, or other suitable energy source.

The second patterned mask 130 includes openings for forming the grooves above the openings 125. The patterned mask 130 does not have corresponding openings for the capacitor openings 127 because the etching for these openings has already been completed. If the capacitor openings had not already been completed in the prior step as described above, then at step 35, openings would have been formed in the second patterned mask so that the capacitor's openings could be completed by subsequent processing.

At step 40, the second insulating layer 115 is patterned to form grooves 135 corresponding to the conductive runners and capacitor to be formed. The second insulating layer 115 may be patterned using conventional etching techniques. During etching, the etch stop layer 110 is used to define the endpoint for this etching process. The openings are contained or at least partially contained within the borders 136, 138 of the grooves 135. Then, at step 45, the remaining portions of the mask layers 120, 130 are stripped using well-known techniques and the partially completed integrated circuit is cleaned at step 47 using conventional processes.

At step 50, a conductive layer 145 is blanket deposited above the second insulating layer 115 and in the openings, grooves, and capacitor openings 127. Then, the portions of the conductive layer outside the capacitor openings 127 and the grooves 135 and on or above the second insulating layer are removed to complete the interconnect. This may be accomplished using a conventional chemical mechanical polishing process. The conductive layer 145 is a conducting material such as tungsten, aluminum, copper, nickel, polysilicon, or other conducting material suitable for use as a conductor and as is known to those skilled in this art.

By using this process a capacitor 170 is formed when the dual damascene structures 175 are formed. As a result, finger capacitors may be incorporated into the process for forming dual damascene structures without using additional process steps such as lithography processes and etching. In this way, increased costs for manufacturing an integrated circuit including finger capacitors may be avoided.

Figure 7:
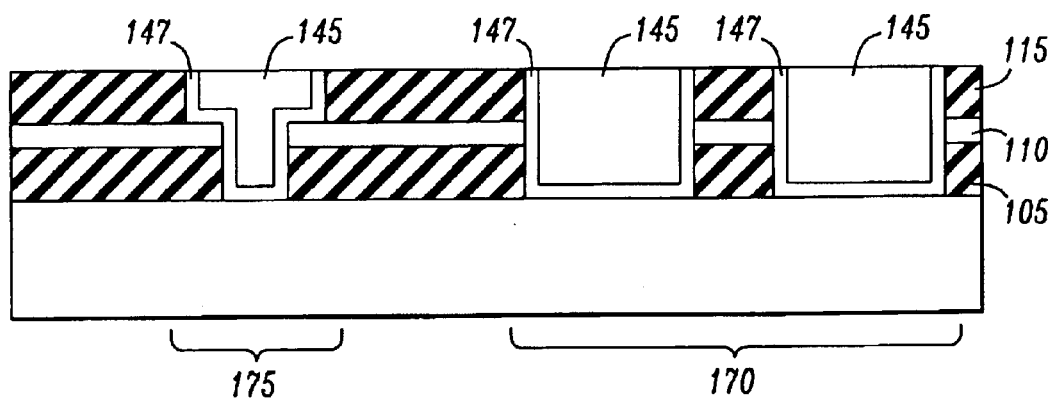

In an alternative embodiment, one of more layers, may be formed prior to the deposition of the conductive layer 145. An exemplary barrier layer 147 is shown in FIG. 7. These layers may be barrier layers preventing the migration of moisture and contaminants between the conductive layer and the surrounding layers.

For example, if the conductive layer 145 is copper, a barrier layer 147 including layers of Ta and TaN may be deposited on the second insulating layer 120 and in the openings and grooves prior to the deposition of the conductive layer. Where the conductive layer 145 includes Al, a barrier layer 147 including layers of (1) Ti and TiN or (2) Ti and TiN and Ti may be used. Other materials for the barrier layer include WSi, TiW, Ta, TaN, Ti, TiN, Cr, Cu, Au, WN, TaSiN, or WSiN. The barrier layer 147 may also function as an adhesion layer and/or a nucleation layer for the subsequently formed conductive layer. In addition, a capping layer, such as $Si_3N_4$, TaN, TiN, or TiW may be formed on the upper surface of the conductive layer.

Figure 8:
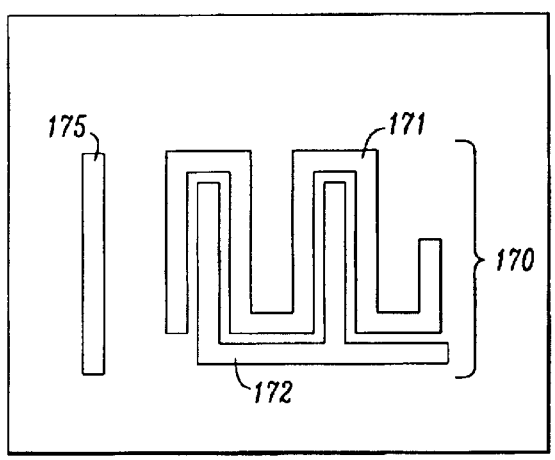
FIG. 8 is a top view of a partially fabricated integrated circuit including a finger capacitor and a dial damascene structure manufactured according to the process of FIG. 1.

FIG. 8 is a top view of an illustrative finger capacitor and a dual damascene structure formed using the above illustrative embodiment. The finger capacitor 170 includes a first plate 171 and a second plate 172. The interconnection of the capacitor with other portions of the integrated circuit has been omitted for clarity. One skilled in the art would be able to integrate the capacitor in an integrated circuit as necessary to compete the circuitry to be designed.

Subsequently, the integrated circuit is completed by adding, if necessary, additional metal levels that may including interconnects formed using the process above and conventional processes to complete an integrated circuit. The integrated circuit also includes transistors and other components necessary for a particular integrated circuit design. The processes for manufacturing an integrated circuit including these structures are described in 1–3 Wolf, *Silicon Processing for the VLSI Era*, (1986), which is incorporated herein by reference.

Figure 9:
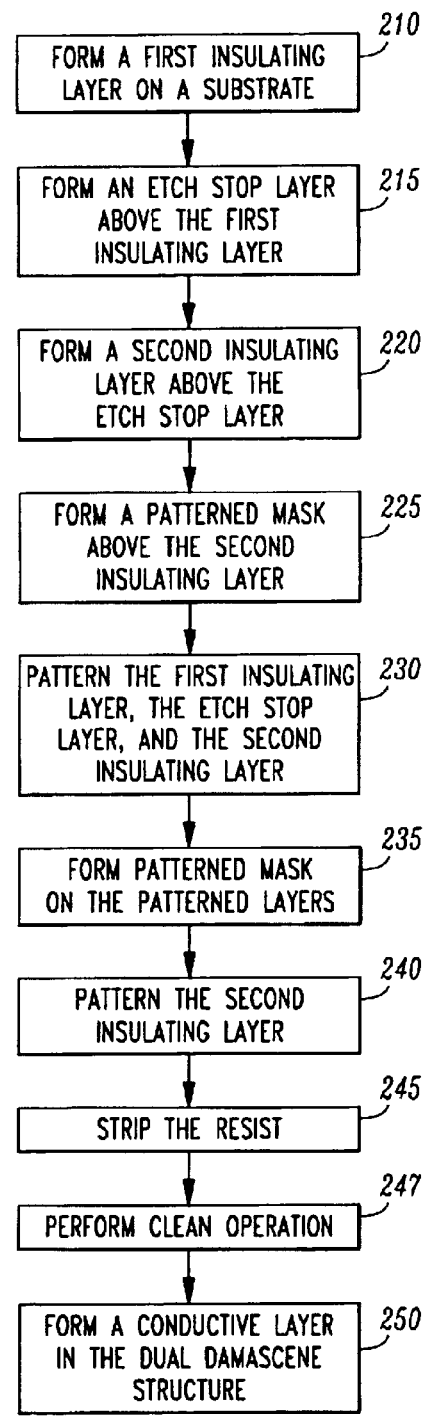
FIG. 9 is a flowchart diagram illustrating the process for manufacturing an integrated circuit according to another illustrative embodiment of the present invention.
Figure 10:
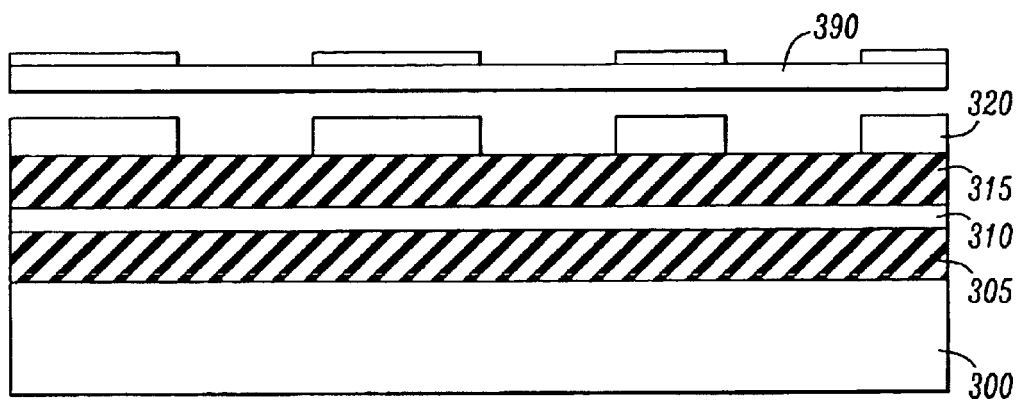
FIGS. 10–15 are schematic diagrams of an integrated circuit during successive stages of manufacture using the process of FIG. 9.
Figure 11:
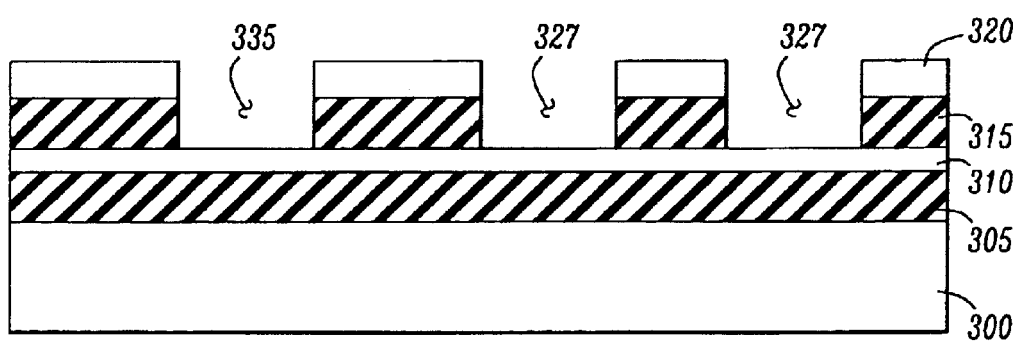
Figure 12:
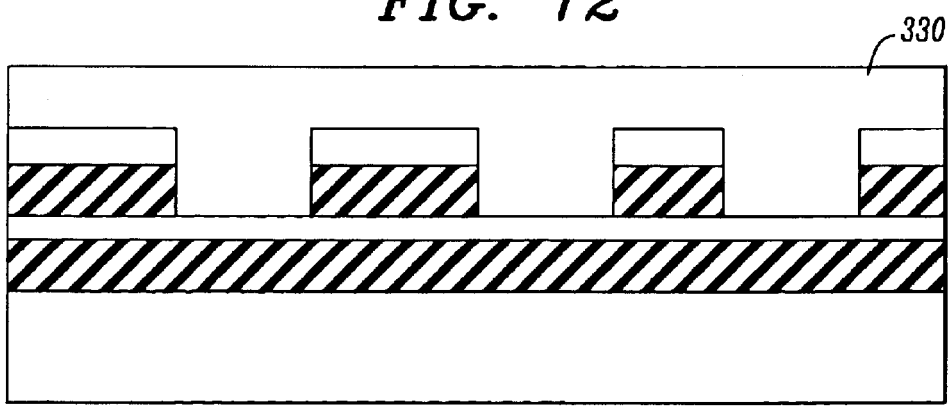
Figure 13:
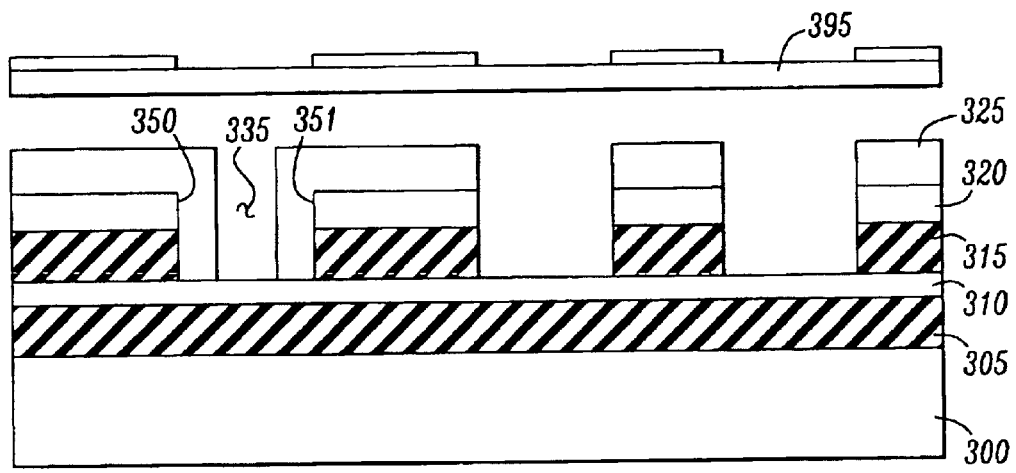
Figure 14:
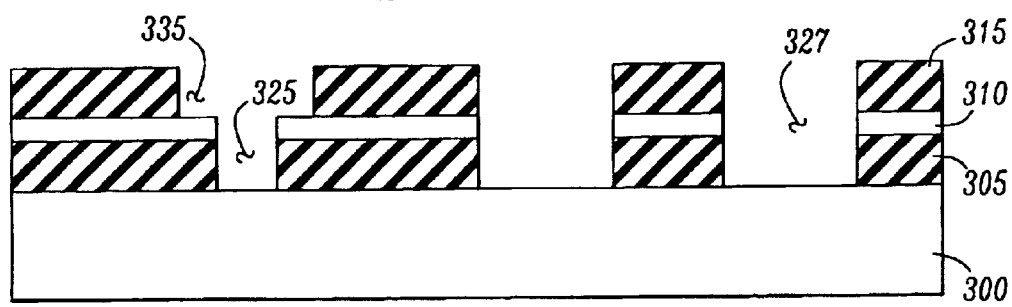

FIGS. 9–15 illustrate another alternative embodiment of the present invention. FIG. 9 is a flow chart diagram and FIGS. 10–15 are schematic diagrams illustrating the successive stages of manufacture of an integrated circuit according to the flow chart shown in FIG. 9.

At step 210, a first insulating layer 305 is formed on a substrate 300. The first insulating layer 305 I is a material as described above with regard to the first insulating layer 105. The substrate 300 is a material as described above with regard to the substrate 100. In addition, the upper surface 301 of the substrate 300 may not be planar. In this case, the first insulating layer 305 may be planarized using, for example, chemical mechanical polishing (CMP) as is well known.

At step 215, an etch stop layer 310 is formed above or in direct contact with the first insulating layer 305. In an alternative embodiment, one or more layers may be formed between the etch stop layer 310 and the first insulating layer 305. The etch stop layer 310 is a material such as the material described above with regard to the first etch stop layer 110.

At step 220, a second insulating layer 315 is formed above or in direct contact with the etch stop layer 315. The second layer 315 may be formed using the same materials and processes used to form the first insulating layer 305. At step 225, a first patterned mask 320 is formed above or on the insulating layer 315. The first patterned mask 320 includes openings that correspond to the runners or grooves to be formed. In addition, the first patterned mask 320 includes openings that correspond to the openings 327 for a capacitor (hereinafter referred to as the "capacitor openings"). The reticle 390 has a pattern that is translated to the first patterned mask so that the capacitor openings 327 may be formed when openings 325 are formed.

At step 230, capacitor openings 327 and grooves 335 are opened in the second insulating layer 315. The grooves 335 may be formed using conventional etching techniques. During etching, the etch stop layer 310 is used to define the endpoint for this etching process. Subsequently, at step 235, a second patterned mask 330 is formed above or on the first patterned mask 320. The second patterned mask is formed so that the openings in this mask correspond to the via or contact openings (hereinafter "openings") to be formed. Further, the second patterned mask includes openings corresponding to the capacitor openings to be formed. A portion of the second patterned mask may be formed on the walls 350, 351 of the grooves 335. As a result, the walls 350, 351 may not be further etched during the formation of the openings. In contrast, a portion of the second patterned layer may not be formed on the walls of the capacitor openings.

At step 240, the etch stop layer 310 and the first insulating layer 305 are patterned to form openings 325 corresponding to the interconnects between layers to be formed. The capacitor openings 327 are also formed by etching the stop layer 310 and the first insulating layer 305. The openings 325 and capacitor openings 327 may be formed using conventional etching techniques or a combination of techniques to etch through at least the two different layers.

The openings 325 are contained or at least partially contained within boundaries defined by the walls 350, 351 of the grooves 335. Then, at step 245, the remaining portions of the mask layers 320, 330 are stripped using well-known techniques and the partially completed integrated circuit is cleaned at step 247 using conventional processes.

At step 250, a conductive layer 345 is blanket deposited above the second insulating layer 315 and in the openings, grooves, and capacitor openings. Then, the portions of the conductive layer outside the capacitor openings 327 and grooves 335 and on or above the second insulating layer 315 are removed. This may be accomplished by using a conventional chemical mechanical polishing process. The conductive layer 345 is a conducting material such as tungsten, aluminum, copper, nickel, polysilicon, or other conducting material suitable for use as a conductor as is known to those skilled in this art.

Figure 15:
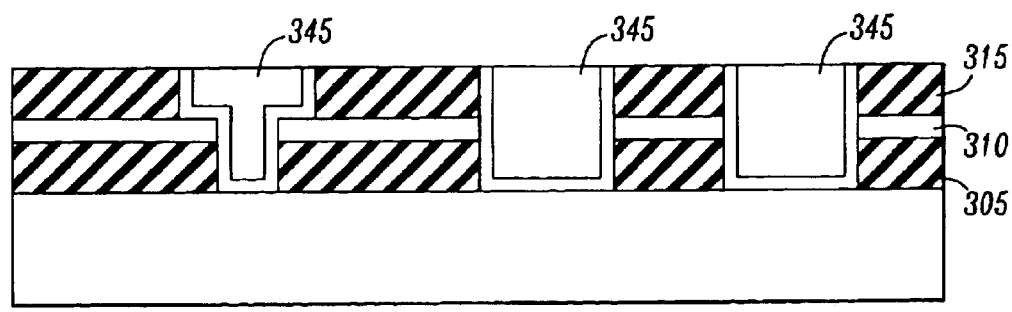

In an alternative embodiment, one of more layers may be formed prior to the deposition of the conductive layer 345 as described above with regard to the first embodiment and shown in FIG. 15. These one or more layers may be referred to as a liner. In addition, a capping layer as described above with regard to the first embodiment may be provided. Subsequently, the integrated circuit is completed by adding, if necessary, additional metal levels that may including interconnects formed using the process above and conventional processes to complete an integrated circuit.

Although the three layers including the first insulating layer, the etch stop, and the second insulating layer are shown, the number of these layers may be reduced. For example, the capacitor and the dual damascene structure may be formed in one or two insulating layers where the openings for the capacitor and the dual damascene structure are formed at substantially the same time.

Although the invention has been described with reference to exemplary embodiments, it is not limited to those embodiments. Rather, the appended claims should be construed to include other variants and embodiments of the invention that may be made by those skilled in the art without departing from the true spirit and scope of the present invention.

What is claimed:

1. A method for manufacturing an integrated circuit comprising:

forming a layer having a stop layer, forming an opening for a dual damascene structure in the layer that includes at least a groove and a via where the via extends through the stop layer; and forming at least two openings in the layer for a capacitor having a first electrode and a second electrode, wherein the first and second electrodes are each defined by an opening that extends through the stop layer and the layer.

2. The method of claim 1 wherein forming an opening for a dual damascene structure and forming at least two openings in the layer for a capacitor occur at substantially the same time.

3. The method of claim 1 further comprising:

filling the opening for a dual damascene structure with a conductive material; and filling the at least two openings in the layer for a capacitor with a conductive material.

4. The method of claim 3 wherein filling the opening for a dual damascene structure and filling the at least two openings in the layer for a capacitor occur at substantially the same time.

5. The method of claim 1 wherein the layer comprises a plurality of layers.

6. A method of manufacturing an integrated circuit comprising:

forming a plurality of layers;

partially forming a dual damascene structure by forming a first opening in a least one of the plurality of layers; and partially forming a capacitor by forming second and third openings in the at least one of the plurality of layers, wherein the second and third openings extend through the at least one of the plurality of layers.

7. The method of claim 6 wherein the first, second, and third openings have substantially the same width.

8. The method of claim 6 the second and third openings have a first width and the first opening has a second width different from the first width.

* * * * *